United States Patent [19]

Koch

[11] Patent Number: 4,760,496

[45] Date of Patent: Jul. 26, 1988

[54] SWITCH CABINET WITH FRAME SUPPORT

[75] Inventor: Hans-Georg Koch, Dietzhölztal, Fed. Rep. of Germany

[73] Assignee: Rittal-Werk Rudolf Loh GmbH & Co. KG, Fed. Rep. of Germany

[21] Appl. No.: 35,452

[22] Filed: Apr. 7, 1987

[30] Foreign Application Priority Data

Apr. 8, 1986 [DE] Fed. Rep. of Germany ....... 3611693

[51] Int. Cl.⁴ .............................................. H05K 9/00
[52] U.S. Cl. ................................. 361/424; 174/35 R; 174/35 GC; 220/430; 220/467
[58] Field of Search ............... 174/35 R, 35 GC, 50.5, 174/50.51; 220/430, 467; 312/223, 257 SK; 361/391, 424, 429

[56] References Cited

U.S. PATENT DOCUMENTS

| | | | |
|---|---|---|---|
| 2,704,301 | 3/1955 | Feketics | 361/424 |
| 3,925,710 | 12/1975 | Ebert | 174/35 GC |
| 3,994,490 | 7/1971 | Mitchell et al. | 174/35 GC |
| 4,631,641 | 12/1986 | Brombal et al. | 174/35 R |
| 4,643,319 | 2/1987 | Debus et al. | 211/189 |

FOREIGN PATENT DOCUMENTS 3431712 8/1984 Fed. Rep. of Germany .
2151461 7/1985 United Kingdom ................ 361/390

OTHER PUBLICATIONS

Lockhart, "Fingerstock Expander" IBM Technical Disclosure Bulletin, vol. 12, No. 3, 8/69, p. 413.

*Primary Examiner*—A. D. Pellinen
*Assistant Examiner*—Gregory D. Thompson
*Attorney, Agent, or Firm*—Thomas W. Speckman; Ann W. Speckman

[57] ABSTRACT

A switch cabinet includes a frame support, the front and rear sides of which are sealable by two casing doors mounted on the frame support, or a casing door mounted on the frame support, and a rear wall attached in a detachable manner on the frame support. HF-shielding of the switch cabinet is achieved when a box-shaped and HF-tight assembly having two side walls, one top wall, and one base wall, is mounted in and connected to the frame support.

16 Claims, 2 Drawing Sheets

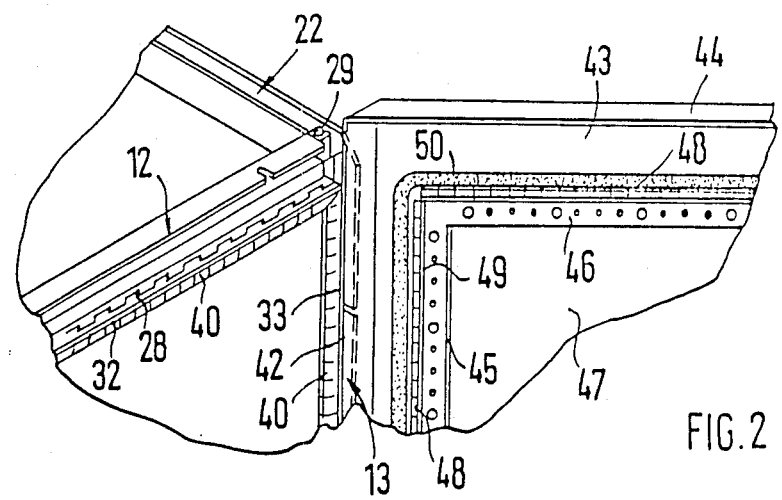
FIG. 2
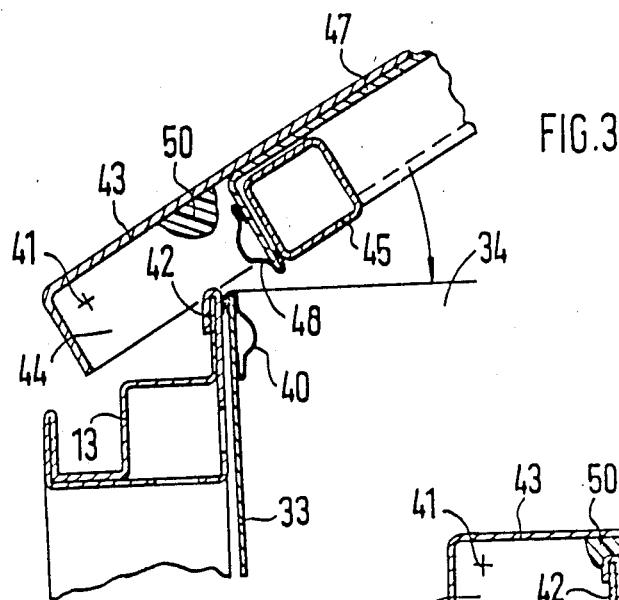
FIG. 3
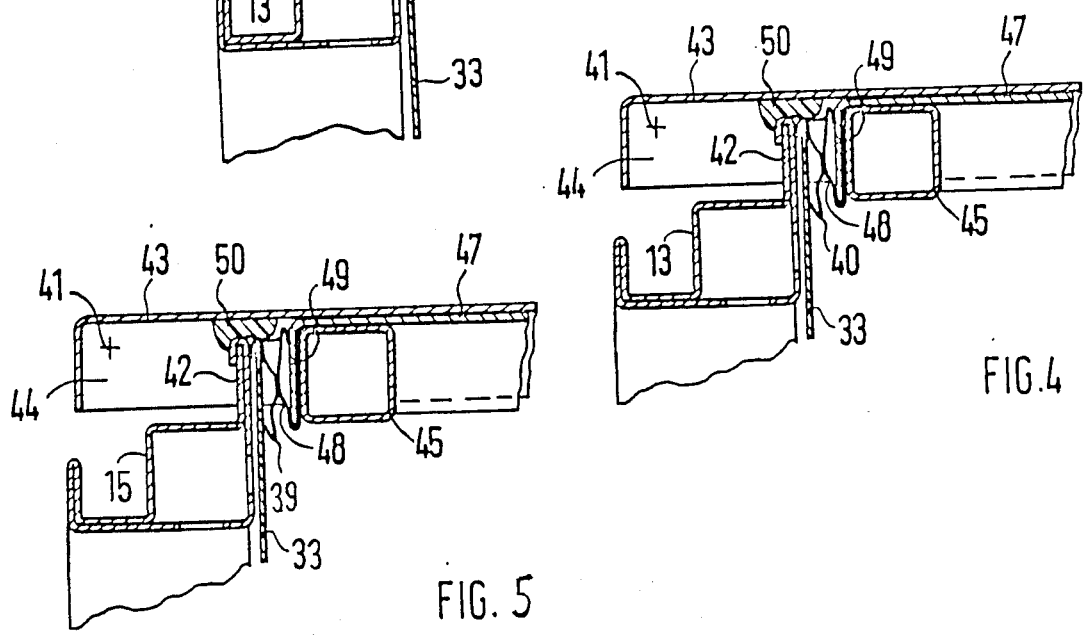
FIG. 4
FIG. 5

SWITCH CABINET WITH FRAME SUPPORT

BACKGROUND OF THE INVENTION

1. Field of the Invention

This invention relates to a switch cabinet with a rectangular frame support, the front and rear sides of the switch cabinet are sealable by means of two casing doors hinged on the frame support, or by means of a casing door hinged on the front frame support and a rear wall attached in a detachable manner on the rear frame support. The remaining sides of the switch cabinet are covered by means of covering plates which can be attached in a detachable manner on the frame support.

2. Description of the Prior Art

Such a switch cabinet is not protected against electromagnetic radiation, since the cover plates, rear walls and casing doors, which are preferably treated on their surfaces have no adequate electrically conductive connection with the frame support. This transition is often made even worse by the fact that the cover plates, rear walls and casing doors are connected to the frame support by fastening screws, and supported on the frame support outside the attachment points by means of sealing strips.

German Patent Publication DE-OS No. 34 31 712 teaches electronic devices or a framework with plug-in units which may be shielded in an HF-impermeable manner by inverting a metal hood unit over the device or the framework, placing the device or the framework on a base plate, and then connecting the hood unit and the base plate in an electrically conductive manner. To facilitate access to the devices or the framework, one wall of the hood unit may be provided with a door, which is connected with the hood unit in the known manner by means of known types of contact strips.

These known types of shielding hoods are not suited for switch cabinets of the type stated, which already has one or two casing doors. The hood unit would have to accommodate, in addition, one or two further doors which are shielded against HF, which would considerably increase the expense of shielding the switch cabinet. A closed hood unit which may be removable from the base plate is not satisfactory, since the space in which the switch cabinet is installed often does not provide the necessary height for removing the hood unit. In a switch cabinet requiring frequent access to built-in electrical devices and equipment, such an arrangement is entirely unsatisfactory.

SUMMARY OF THE INVENTION

It is an object of this invention to shield a switch cabinet of the type described above in an HF-tight manner, without making access to the internal space of the switch cabinet more difficult or requiring considerable additional expense for the doors.

This objective of HF-shielding is achieved, in accordance with the present invention, as follows: a box-shaped and HF-tight assembly having two sidewalls, a top wall, one base wall, and two open sides is installed on a frame support, and connected to the frame support; the front and rear sides of the frame support coincide with the openings of the HF-tight assembly. The HF-tight assembly is provided with elastic contact strips around the perimeter of both openings. The casing doors and the rear wall of the frame support are provided on their inner sides with shielding plates which have a peripheral flange corresponding to the openings of the HF-tight assembly and the flanges of the shielding plates are provided with elastic contact strips on all their outer edges, which contact strips, when the switch cabinet door and rear wall are in a closed position, abut the contact strips on the HF-tight assembly in an HF-tight manner.

The HF-tight assembly installed in the frame support provides HF-shielding on four sides of the switch cabinet, so that only the front and rear sides, which can be optionally closed with two casing doors or with one casing door and a rear wall, need to be shielded. Shielding plates may be installed on the casing door and the rear wall and connected to the HF-tight assembly in an electrically conductive manner by means of known types of contact strips, and the HF-tight assembly may also be provided with contact strips at points corresponding to the shielding plates. The casing door may be opened and closed, as is the case with an unshielded switch cabinet, so that its surface remains electrically conductive. The electrical contact is provided by the abutting contact strips, and the gaps between the assembly and both shielding plates are continuously bridged in an electrically conductive manner. In the closed position of the switch cabinet, the entire interior space is thus sealed in an HF-tight manner. The front and rear sides of the switch cabinet may be sealed with casing doors, or the front side may be sealed with a casing door, and the rear side may be sealed with a rear wall.

Switch cabinets of this type may be aligned next to one another without side walls and without the HF-shielding of the individual switch cabinets being impaired. The HF-tight assemblies may be trimmed with sheet metal, and may be welded together. Larger HF-tight assemblies preferably comprise individual plates. In this embodiment, side plates forming the side walls of the HF-tight assembly preferably have bevelled sections on their horizontal edges which overlap a top plate and a base plate of the HF-tight assembly, and the top plate and base plate are thereby connected over a large surface area with the bevelled sections of the side plates.

In accordance with another embodiment, the HF-tight assembly is mounted in the frame support by means of strips which are in contact with at least the vertical frame support unit of the frame support, and attachment flanges provided on the strips projecting into the interior space of the assembly so that equipment, component supports, and the like may be attached to these strips.

Mounting contact strips on the HF-tight assembly and the shielding plates is achieved, in accordance with another embodiment, in that the contact strips have a generally U-shaped cross section, their terminal ends form clamping mounts, and contact strips are mounted around the peripheral edges of the HF-tight assembly surrounding the openings and around the peripheral edges of the shielding plates.

Another embodiment provides that the inner edges of the shielding plates on the casing door and rear wall are reinforced by means of a framework comprising quadrilateral tubular sections, and that these tubular sections are provided with rows of attachment mounts to attach devices and the like to the casing doors and the rear wall without impairing the HF shielding. Sealing of the switch cabinet in the area of the front and rear sides is simplified according to an embodiment wherein the frame units of the frame support, in the area of the front and rear sides, have projecting sealing bars which form a closed framework, so that when the casing doors and rear wall are sealed, these sealing bars, together with the edges of the assembly, abut on the common sealing strips of the casing door or the rear wall in the area of the openings.

BRIEF DESCRIPTION OF THE DRAWINGS

The invention will now be described in greater detail by means of the embodiments shown in the drawings, wherein:

FIG. 2 shows a partial perspective view of the frame support of a switch cabinet with a casing door hinged on the frame support;

FIG. 3 shows a partial cross-sectional view of the frame support of a switch cabinet with the hinged, open casing door, and the HF-tight assembly positioned in the frame support;

FIG. 4 shows a partial cross-sectional view corresponding to FIG. 3, with a closed and shielded casing door; and FIG. 5 shows a partial cross-sectional view of a closed and shielded rear casing door or rear wall.

DESCRIPTION OF PREFERRED EMBODIMENTS

Figure 1:
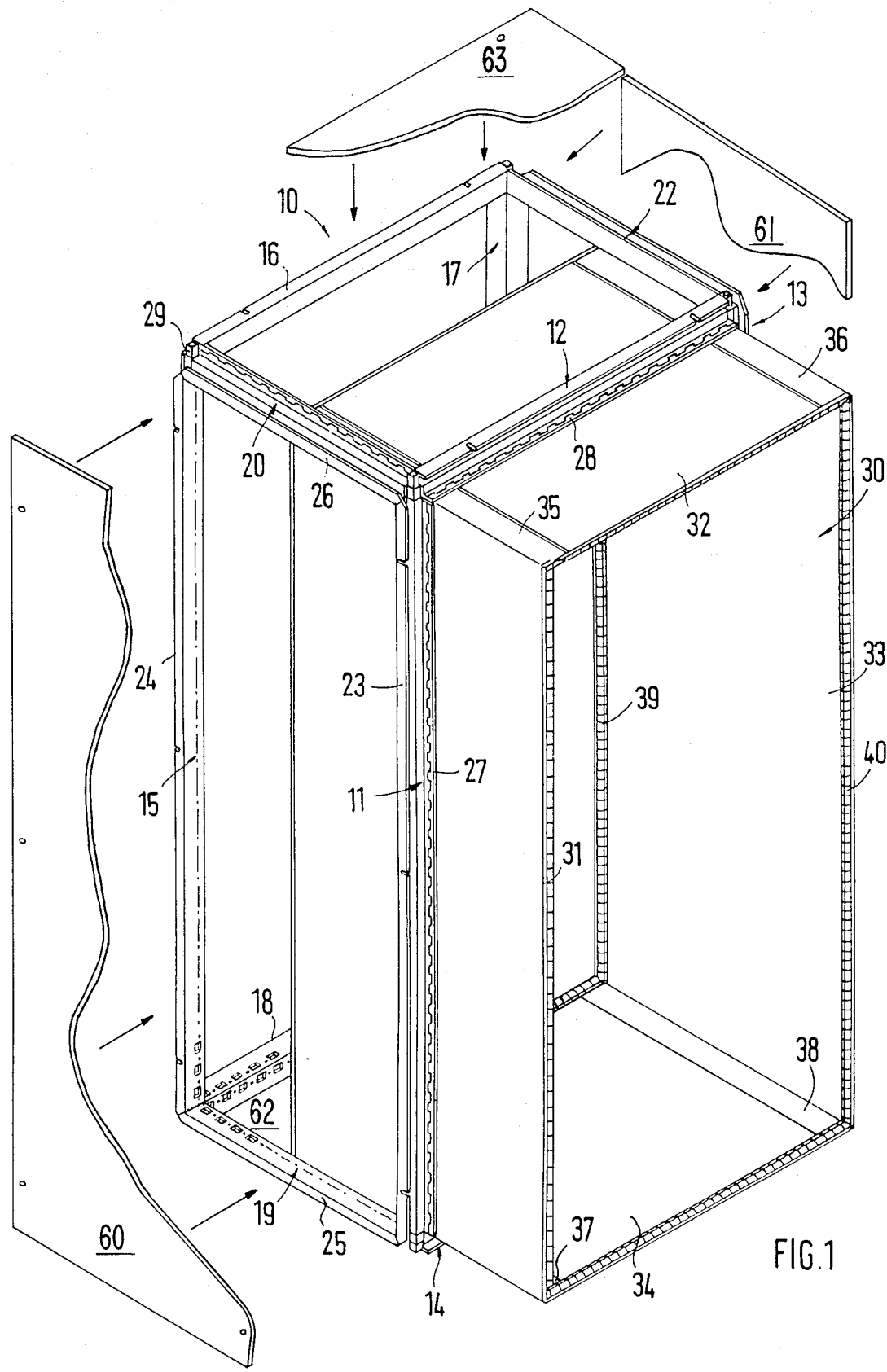
FIG. 1 shows a perspective view of the frame support of a switch cabinet with the insertable HF-tight assembly for HF-shielding.

The switch cabinet comprises frame support (10), which is composed of twelve frame units, of which, in FIG. 1, frame units (11, 12, 13 and 14) form the front side of the switch cabinet, frame units (11, 15, 19 and 20) form a first side of the switch cabinet, frame units (15, 16, 17 and 18) form the rear side of the switch cabinet, and frame units (13, 17 and 22) which are visible in FIG. 1 together with a frame unit not visible in FIG. 1 but parallel to frame unit 22 joining the bottom of frame units 13 and 17 form a second side of the switch cabinet. Covering plates are shown attachable to frame support (10). The frame units are profile sections, which are attached to one another in the corner areas of frame support (10) by means of corner connecting units (29).

The first and second sides of frame support (10) and the base and top may be covered by means of cover plates (60, 61, 62, 63) which may be attached to flanges projecting from the frame units. These flanges form an attachment frame, to which the covering plates may be attached, such as flanges (23, 24, 25 and 26) on frame units comprising the first side. Sealing bars projecting at right angles to the front and rear planes of frame support (10) extend from frame units (11, 12, 13 and 14) as sealing bars (27, 28 and 42) as shown in FIGS. 1 and 2. The sealing bar extending from frame unit (14) is not visible in FIG. 1. These sealing bars form a continuous framework.

For purposes of HF-shielding, HF-tight assembly (30) may be inserted into frame support (10), and attached therein. Assembly (30) is composed of first and second side plates (31 and 33), top plate (32), and base plate (34). Lower and upper ends of side plates (31 and 33) preferably have bevelled sections (35, 36, 37 and 38) which partially overlap top plate (32) and base plate (34), which are attached over a large surface to these sections. Box-shaped assembly (30) is thereby HF-tight on its four sides, and may be attached to frame support (10) so that its openings coincide with the front and rear openings of frame support (10). The edges of assembly (30) in the area of these openings snugly seal with the sealing bars of the frame support on the front and rear side of the switch cabinet. Elastic contact strips (39 and 40) are provided around the edges of assembly (30) and form the counter-contacts for elastic contact strips which are provided on the casing door and the rear wall.

As shown in FIGS. 2–4, casing door (43) is provided with peripheral flange (44) and supports shielding plate (47) on its internal side, and shielding plate (47) is likewise provided with peripheral flange (49). Flange (49) supports, on its external side, elastic contact strips (48). When casing door (43) is closed, flange (49) with contact strips (48) projects into the opening of assembly (30), so that contact strips (48) on flange (49) abut contact strips (40) on assembly (30) and produce an electrically conductive connection around flange (49) with assembly (30).

FIG. 2 shows that sealing bars (28 and 42) on frame units (12 and 13) seal tightly with the edges of top plate (32) and second side plate (33), when HF-tight assembly (30) is attached to frame support (10). Strips (not shown) which are aligned with the frame units of frame support (10) are preferably used to achieve this seal and are attached to the frame units, for example, by screwing. These strips may be arranged, with their attachment flanges, on the internal surface of assembly (30), so that equipment, component supports, and the like may be attached to the strips.

Casing door (43) is articulated with frame unit (13) about axis (41). For this purpose, hinges may be used, whereby one hinge part is provided on flange (44) of casing door (43), and the other hinge part is provided on frame unit (13).

On the inner side of flange (49) around shielding plate (47), a framework composed of quadrilateral tube sections (45, 46) may be provided which reinforces the casing door and may also be provided with attachment mounts or holes, so that equipment and the like may be attached to the inner side of casing door (43) which is provided with shielding plate (47).

When casing door (43) is closed, elastic contact strips (40 and 48) form an abutting contact, which closes the gaps between the opening of HF-tight assembly (30) and flange (49) around shielding plate (47). When casing door (43) is closed, contact strips (40 and 48) are deformed, so that they contact one another in tension. Contact strips (40 and 48) are preferably generally U-shaped, and the terminal ends form clamping mounts, so that they may be mounted at the edge of assembly (30) or shielding plate (47). The other terminal ends abut the inner wall of assembly (30) or the external side of flange (49) of shielding plate (47), as shown in FIG. 4.

At flange (49) of shielding plate (47), the inner side of casing door (43) supports rounded sealing strip (50), which, when casing door (43) is closed, seals against the sealing bars of frame support (10) and the flanges of the HF-tight assembly (30), as shown in FIG. 4.

The rear side of the switch cabinet may be closed in the same manner as described above by means of a casing door. According to this embodiment, as shown in FIG. 5, the casing door may be hinged to frame unit (15) or frame unit (17). The rear side may, however, also be covered in an HF-tight manner by means of a rear wall. The rear wall may be constructed in the same manner as casing door (43) with shielding plate (47). The rear wall, however, may be fastened to frame units (15, 16, 17 and 18), whereby the contact strips (48) abut contact strips (39) of the assembly, to produce the electrically conductive connection between the shielding plate of the rear wall and HF-tight assembly (30).

I claim:

1. An HF-tight switch cabinet comprising: a rectangular box-shaped frame support comprising a plurality of frame units defining a first and an opposite second side, a top and opposite base, a front and opposite rear, said front and rear are each sealable by means of a casing door hinged on said frame support at each of said front and said rear, and said first and second sides, and said top and base are closeable by cover plates detachably attached to said frame support, and a generally box-shaped and HF-tight assembly (30) comprising two solid side plates (31, 32), a top plate (32), a base plate (34) and two opposite openings mounted in said frame support (10) with said front and rear of said frame support (10) coinciding with said openings of said HF-tight assembly (30), said HF-tight assembly (30) having elastic contact strips (39, 40) around the periphery of its said openings, front and rear casing doors (43) provided on their inner sides with shielding plates (47) which have peripheral flanges (49) fitting within said openings of said HF-tight assembly (30), said peripheral flanges (49) having elastic contact strips (48) on their outer peripheral surfaces which abut said contact strips (39, 40) of said HF-tight assembly (30) when said casing doors (43) are in a closed position, whereby, in said closed position, said HF-tight assembly is sealed on all sides in an HF-tight manner.

2. An HF-tight switch cabinet in accordance with claim 1, characterized in that said two side plates (31, 33) of said HF-tight assembly are provided with bevelled sections (35, 36, 37, 38) on their upper and lower ends, said bevelled sections partially overlap said top plate (32) and said base plate (34) of said HF-tight assembly (30), and said top plate (32) and said base plate (34) are connected to said two side plates (31, 33) at said bevelled sections (35, 36, 37, 38).

3. An HF-tight switch cabinet in accordance with claim 2, characterized in that said contact strips (39, 40, 48) are generally U-shaped in cross section, with their terminal ends forming clamping mounts and said contact strips (39, 40, 48) are mounted on peripheral edges of said HF-tight assembly (30) and on said peripheral flanges (49) of said shielding plates (47).

4. An HF-tight switch cabinet in accordance with claim 3, characterized in that said peripheral flanges (49) of said shielding plates (47) on said casing doors (43) are reinforced by tubular sections (45) mounted adjacent said peripheral flanges (49), said tubular sections (45) provided with attachment mounts for attaching equipment to the inner side of said casing doors.

5. An HF-tight switch cabinet in accordance with claim 4, characterized in that said frame units (11, 12, 13, 14, 15, 16, 17, 18) forming said frame support, in the area of said front and rear, are provided with sealing bars (27, 28, 42) projecting at substantially right angles to the planes of said front and rear which form a continuous frame bar around said front and rear and said casing doors (43) are provided with peripheral sealing strips (50) adjacent said shielding plates (47) whereby said peripheral sealing strips (50) abut with said sealing bars (27, 28, 42) when said casing doors (43) are in a closed condition.

6. An HF-tight switch cabinet in accordance with claim 1, characterized in that said contact strips (39, 40, 48) are generally U-shaped in cross section, with their terminal ends forming clamping mounts and said contact strips (39, 40, 48) are mounted on peripheral edges of said HF-tight assembly (30) and on said peripheral flanges (49) of said shielding plates (47).

7. An HF-tight switch cabinet in accordance with claim 1, characterized in that said peripheral flanges (49) of said shielding plates (47) on said casing doors (43) are reinforced by tubular sections (45) mounted adjacent said peripheral flanges (49), said tubular sections (45) provided with attachment mounts for attaching equipment to the inner side of said casing doors.

8. An HF-tight switch cabinet in accordance with claim 1, characterized in that said frame units (11, 12, 13, 14, 15, 16, 17, 18) forming said frame support, in the area of said front and rear, are provided with sealing bars (27, 28, 42) projecting at substantially right angles to the planes of said front and rear which form a continuous frame bar around said front and rear and said casing doors (43) are provided with peripheral sealing strips (50) adjacent said shielding plates (47) whereby said peripheral sealing strips (50) abut with said sealing bars (27, 28, 42) when said casing doors (43) are in a closed condition.

9. An HF-tight switch cabinet comprising: a rectangular box-shaped frame support comprising a plurality of frame units defining a first and an opposite second side, a top and opposite base, a front and opposite rear, said front is sealable by means of a casing door hinged on said frame support at said front and said rear is sealable by a rear wall detachably attached to said frame support at said rear, and said first and second sides, and said top and base are closeable by cover plates detachably attached to said frame support, and a generally box-shaped and HF-tight assembly (30) comprising two solid side plates (31, 32), a top plate (32), a base plate (34) and two opposite openings mounted in said frame support (10) with said front and rear of said frame support (10) coinciding with said openings of said HF-tight assembly (30), said HF-tight assembly (30) having elastic contact strips (39, 40) around the periphery of its openings, a front casing door and a rear wall (43) each provided on their inner sides with shielding plates (47) which have peripheral flanges (49) fitting within said openings of said HF-tight assembly, said peripheral flanges (49) having elastic contact strips (48) on their outer peripheral surfaces which abut said contact strips (39, 40) of said HF-tight assembly (30) when said casing door (43) is in a closed position and said rear wall is attached, thereby sealing said HF-tight assembly in an HF-tight manner.

10. An HF-tight switch cabinet in accordance with claim 9, characterized in that said two side plates (31, 33) of said HF-tight assembly are provided with bevelled sections (35, 36, 37, 38) on their upper and lower ends, said bevelled sections partially overlap said top plate (32) and said base plate (34) of said HF-tight assembly (30), and said top plate (32) and said base plate (34) are connected to said two side plates (31, 33) at said bevelled sections (35, 36, 37, 38).

11. An HF-tight switch cabinet in accordance with claim 10, characterized in that said contact strips (39, 40, 48) are generally U-shaped in cross section, with their terminal ends forming clamping mounts and said contact strips (39, 40, 48) are mounted on peripheral edges of said HF-tight assembly (30) and on said peripheral flanges (49) of said shielding plates (47).

12. An HF-tight switch cabinet in accordance with claim 11, characterized in that said peripheral flanges (49) of said shielding plates (47) on said casing door (43) and said rear wall are reinforced by tubular sections (45) mounted adjacent said peripheral flanges (49), said tubular sections (45) provided with attachment mounts for attaching equipment to the inner side of said casing door and said rear wall.

13. An HF-tight switch cabinet in accordance with claim 12, characterized in that said frame units (11, 12, 13, 14, 15, 16, 17, 18) forming said frame support, in the area of said front and rear, are provided with sealing bars (27, 28, 42) projecting at substantially right angles to the planes of said front and rear which form a continuous frame bar around said front and rear, and said casing door and said rear wall are provided with peripheral sealing strips (50) adjacent said shielding plates (47) whereby said peripheral sealing strips (50) abut with said sealing bars (27, 28, 42) when said casing door is in a closed condition and said rear wall is attached.

14. An HF-tight switch cabinet in accordance with claim 9, characterized in that said contact strips (39, 40, 48) are generally U-shaped in cross section, with their terminal ends forming clamping mounts and said contact strips (39, 40, 48) are mounted on peripheral edges of said HF-tight assembly (30) and on said peripheral flanges (49) of said shielding plates (47).

15. An HF-tight switch cabinet in accordance with claim 9, characterized in that said peripheral flanges (49) of said shielding plates (47) on said casing door (43) and said rear wall are reinforced by tubular sections (45) mounted adjacent said peripheral flanges (49), said tubular sections (45) provided with attachment mounts for attaching equipment to the inner side of said casing door and said rear wall.

16. An HF-tight switch cabinet in accordance with claim 9, characterized in that said frame units (11, 12, 13, 14, 15, 16, 17, 18) forming said frame support, in the area of said front and rear, are provided with sealing bars (27, 28, 42) projecting at substantially right angles to the planes of said front and rear which form a continuous frame bar around said front and rear, and said casing door and said rear wall (43) are provided with peripheral sealing strips (50) adjacent said shielding plates (47) whereby said peripheral sealing strips (50) abut with said sealing bars (27, 28, 42) when said casing is in a closed condition and said rear wall is attached.

* * * * *